(12) United States Patent  
North, Jr.

(10) Patent No.: US 6,465,933 B1
(45) Date of Patent: Oct. 15, 2002

(54) METHOD FOR ELECTRONIC DAMPING OF PIEZOELECTRIC POSITIONERS

(76) Inventor: Howard L. North, Jr., P.O. Box 390, Oldwick, NJ (US) 08858-0390

( * ) Notice: Subject to any disclaimer, the term of this patent is extended or adjusted under 35 U.S.C. 154(b) by 0 days.

(21) Appl. No.: 10/081,378

(22) Filed: Feb. 21, 2002

Related U.S. Application Data

(60) Provisional application No. 60/310,030, filed on Aug. 3, 2001.

(51) Int. Cl.$^7$ .............................................. H01L 41/04
(52) U.S. Cl. ...................................................... 310/317
(58) Field of Search ........................... 310/315, 316.01, 310/316.02, 317

(56) References Cited

U.S. PATENT DOCUMENTS

| | | | | |
|---|---|---|---|---|
| 4,451,710 A | * | 5/1984 | Taylor et al. ................ | 310/315 |
| 5,438,229 A | * | 8/1995 | Ohtsuchi et al. ........ | 310/316.02 |
| 5,594,168 A | * | 1/1997 | Terajima ................. | 310/316.01 |
| 5,714,831 A | * | 2/1998 | Walker et al. .......... | 310/316.01 |

FOREIGN PATENT DOCUMENTS

| | | | | |
|---|---|---|---|---|
| JP | 3-128679 | * | 5/1991 | .................. 310/311 |
| JP | 5-111266 | * | 4/1993 | .................. 310/314 |

* cited by examiner

Primary Examiner—Thomas M. Dougherty (57) ABSTRACT

Electronic damping may be provided to a piezoelectric positioner by developing a voltage signal proportional to the current through the dynamic impedance portion of the positioner impedance and then reducing the voltage applied to the positioner in proportion to this voltage signal. This dynamic impedance portion of the positioner impedance consists of an inductance, a resistance, and a capacitance in series. The inductance is the electrical equivalent of the positioner distributed mass and its load mass. The capacitor is the electrical equivalent of the compliance of the positioner and its support structure. The resistor is the electrical equivalent of the damping of the positioner and its load. The voltage signal proportional to the current through this dynamic impedance is obtained by subtracting from a first voltage proportional to the total current through the positioner a second voltage proportional to the current through the static capacitance portion of the positioner impedance. This first voltage is obtained from a resistor in series with the positioner. This second voltage is not obtainable directly but is equal to a third voltage synthesized by a model impedance comprising a capacitor and resistor in series having the same RC time constant as that of the positioner static capacitance and the resistor in series with the positioner where both resistor/capacitor combinations are energized by the same voltage driving the positioner.

13 Claims, 7 Drawing Sheets

METHOD FOR ELECTRONIC DAMPING OF PIEZOELECTRIC POSITIONERS

This application claims the benefit of provisional application No. 60/310,030, filed Aug. 3, 2001.

BACKGROUND

1. Field of Invention

This invention relates to electronic means to provide a velocity signal for a piezoelectric positioner and the use of this velocity signal to provide damping of the mechanical vibrations thereof.

2. Description of Prior Art

Many positioning systems have a position response related to an applied control signal voltage. Piezoelectric materials have the capacity to convert electric potentials into mechanical strains and vice versa. Thus a piezoelectric positioner has an output position that is substantially linearly proportional to an applied control voltage. Examples of piezoelectric positioner use are the positioning of a micromirror in an optical switch by Riza et al in U.S. Pat. No. 5,208,880, the positioning of a catcher tube in a catcher tube particle sorter by North in U.S. Pat. No. 5,030,002, and the psitioning of a surface in an acoustical loudspeaker. Such positioners often have very little mechanical damping resulting in undesireable resonances or overshoots in position followed by poorly damped oscillations.

One means to dampen position oscillations or resonances is to use mechanical damping devices whereby a retarding force is produced by a position velocity. This mechanical damping can be provided by dashpots, by immersing the moving structure in a viscous fluid, or by other well known means. Such added mechanical damping often adds substantial mass to the positioner which reduces its speed of response and its resonant frequency as well as adding significant cost, size, and complexity to the positioner system.

Another method to dampen position oscillations is to produce a position velocity signal which can be negatively fed back into the driving circuitry to oppose the velocity and thereby reduce the oscillations. This velocity signal may be derived directly from a velocity sensor or indirectly by generating the time derivative of a position sensor signal. Ravizza in U.S. Pat. No. 4,080,636 teaches the use of a piezoelectric position sensor mounted adjacent a piezoelectric actuator to sense the actuator position. This method works very well but cannot be used in some positioner applications due to constraints on cost, size, and mass added to the positioner.

One approach to minimizing unwanted position overshoots and poorly damped oscillations is to shape the input driving waveform. This is taught by Singer et al in U.S. Pat. No. 4,916,635 entitled "Shaping Command Inputs To Minimize Unwanted Dynamics" and is further elaborated on in U.S. Pat. No. 5,638,267 by Singhouse et al. This approach works well when the system's natural resonant frequency and damping are accurately known. However, this approach suffers from the following limitations:

The time to attain a reasonably stable change in position in response to a step input signal is much greater than that which can be attained by a system having about 70% of critical damping where the final position is reached in about 0.52 of the period of the system natural resonant frequency. With a shaped input signal the time to reach final position is greater than the period of the natural resonant frequency.

The system has no improvement in resistance to oscillations induced by external vibrations or by factors other than the input signal.

The system has no improvement in response when the driving signal must be sinusoidal as in the case of an acoustical loudspeaker.

The system response is sensitive to inaccuracies of knowledge of the system natural frequency and damping.

The system response is sensitive to changes in system natural frequency and darting due to changes in temperature, load, ageing, wear, and the like.

Another approach is to use a trapezoidal driving signal where the rise, dwell, and fall times are all equal to the period of the system natural resonance frequency. The utility of this approach is based on the fact that this waveform has no Fourier series components at the system natural resonance frequency. This method suffers from the limitations of the previous case.

An approach to providing electronic damping of a piezoelectric positioner is taught by Walker et al in U.S. Pat. No. 5,714,831. This approach does not sense the positioner velocity. Instead it constructs a model impedance having dynamic characteristics substantially identical to those of the positioner and driven by the same command voltage applied to the positioner. The velocity signal is then derived from the model impedance and used to modify the command voltage applied to the positioner and the model impedance. This approach requires that the model impedance accurately represent the positioner and may require a position sensor to correct the model for any inaccuracies. This approach also provides no improvement in resistance to mechanical oscillations induced by external vibrations or to factors other than the input command signal.

Figure 1:
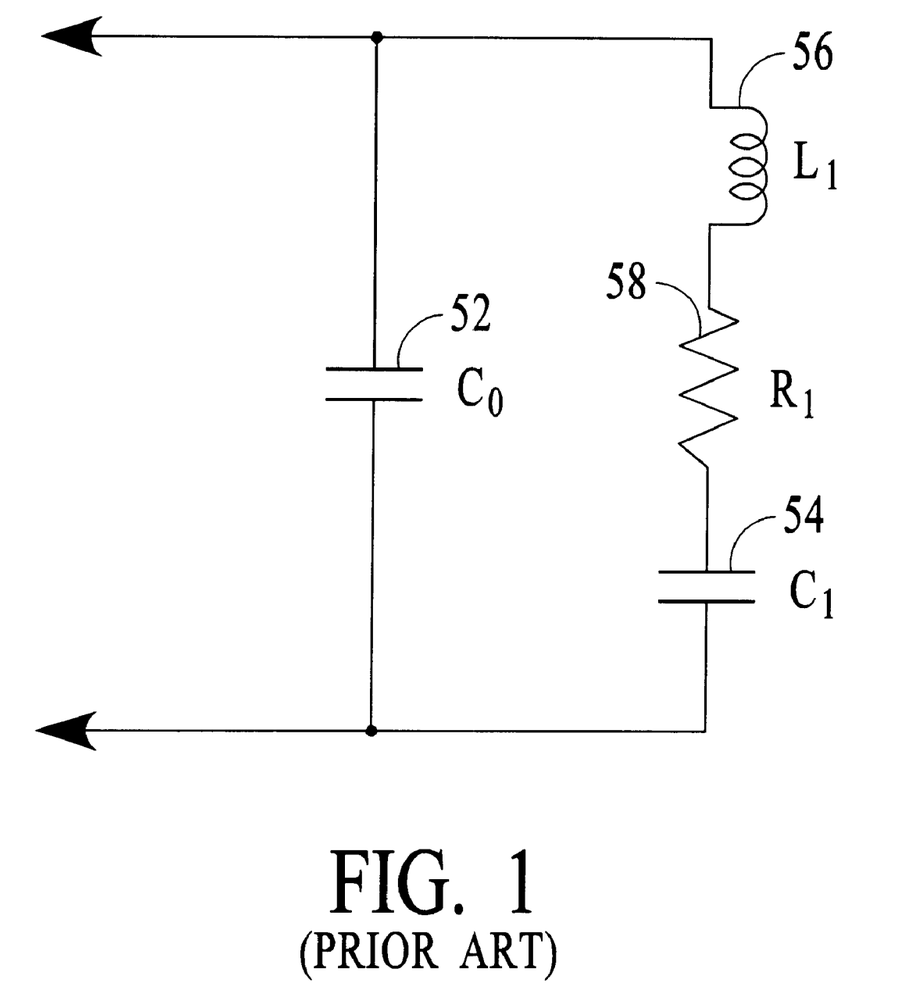
FIG. 1—Electrical Substitute Circuit Diagram of a Piezoelectric Positioner with a Load—Prior Art FIG. 2—Electrical Impedance Magnitude and Phase Angle of a Piezoelectric Positioner with a Load—Prior Art FIG. 3—transient Response of a Piezoelectric Positioner to a Step Change in Voltage Applied Through Different Series Resistors—Prior Art FIG. 4—Voltage Across a Capacitor in a Series LRC Circuit After a Step Change in Applied Voltage—Prior Art FIG. 5—Simplified Electric Schematic of a Closed Loop Velocity Feedback Control FIG. 6—Detailed Electrical Schematic of a Closed Loop Velocity Feedback Control FIG. 7—Nyquist Plot of the Open Loop Transfer Function of a Velocity Feedback Control

The problem of providing damping to a piezoelectric positioner can be understood by examining the Electrical Substitute Circuit Diagram shown on FIG. 1. This diagram is well known and is shown on U.S. Pat. No. 5,714,831, FIG. 14 and U.S. Pat. No. 5,675,296, FIG. 4. This diagram is derived from the complete equivalent circuit by omitting the di-electric loss resistance which is much greater than the impedance of the static capacitance $C_0$ or the dynamic impedance portion of the piezoelectric positioner comprising $L_1 R_1 C_1$ in series. $C_0$ is the static capacitance of the positioner with no motion. $L_1$ represents the combined load mass and the positioner distributed mass. $C_1$ represents the compliance of the positioner and its support structure. $R_1$ represents the system damping produced by positioner internal and external energy losses during motions. The positioner movement is directly proportional to the voltage across $C_1$ and vice versa. Electrical energy is stored in $C_0$ and mechanical energy is stored in $C_1$ and $L_1$. Positioner velocity is proportional to the current through $C_1$ which is not directly available for measurement.

Figure 2:
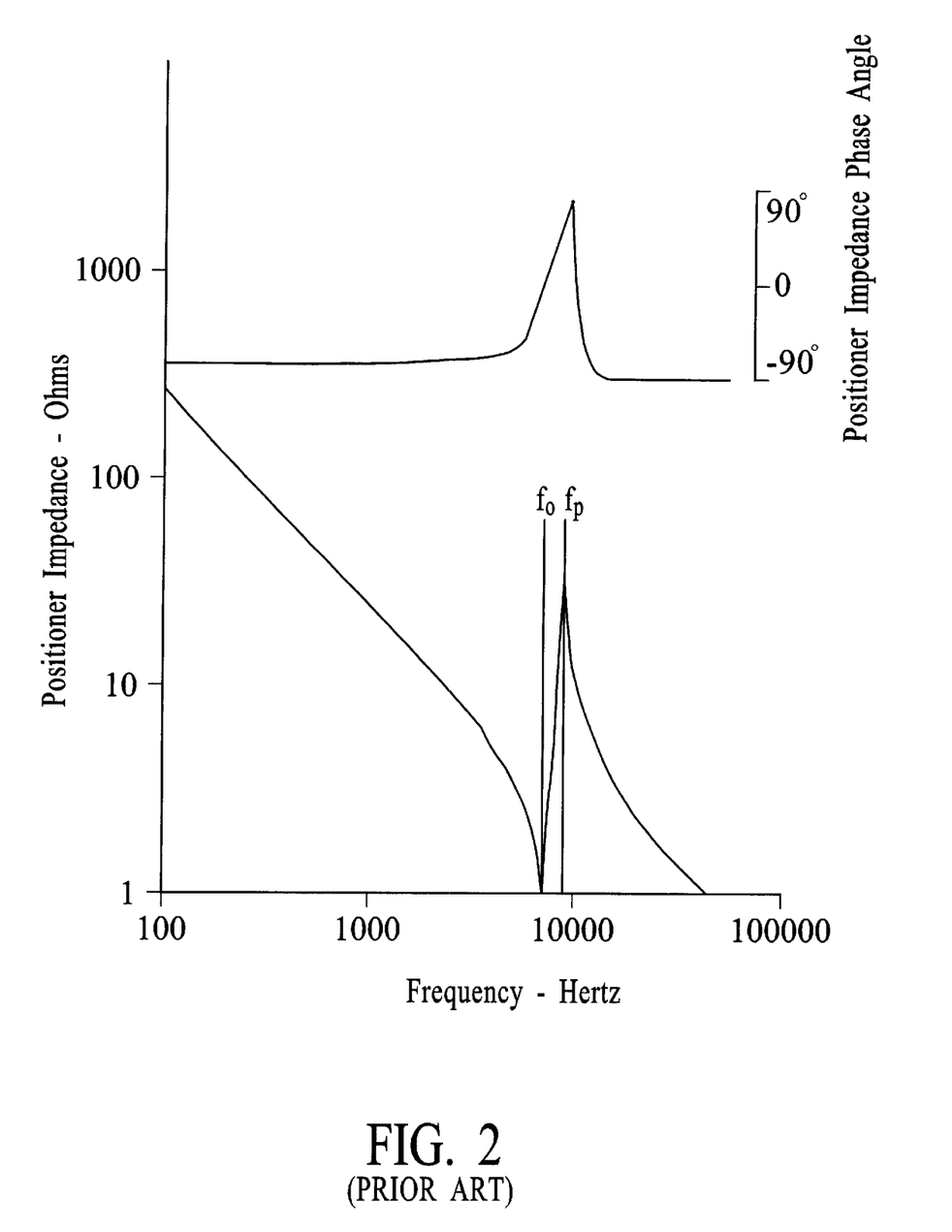

A typical piezoelectric positioner has an impedance magnitude and phase angle similar to that shown on FIG. 2. This positioner impedance has a zero at $f_0$ where the inductive reactance of $L_1$ is canceled by the capacitive reactance of $C_1$ and the current through $L_1 R_1 C_1$ is determined by $R_1$. $R_1$ is typically very small for poorly damped positioners. Thus, driving voltages at $f_0$ produce large currents through $C_1$ with correspondingly large positioner motions.

This positioner impedance has a pole at $f_p$ where the inductive reactance of $L_1$ is canceled by the capacitive reactance of $C_0$ and $C_1$ in series and thus $f_p$ is greater than $f_0$. At $f_p$ the impedance of $L_1 R_1 C_1$ in series is greater than that at $f_0$ and the current through $C_1$ is much lower and the positioner motions are much smaller.

Figure 3:
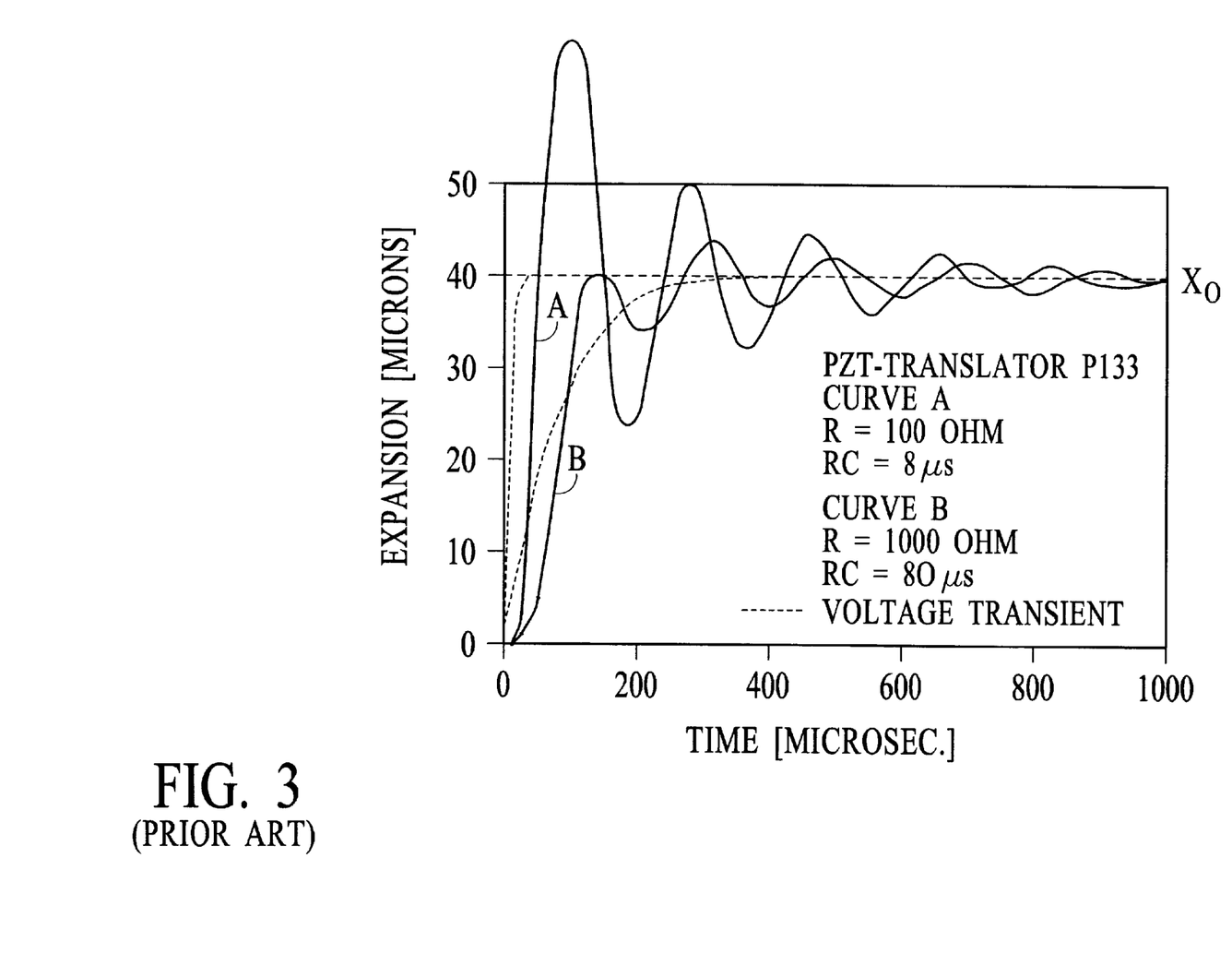

Even when a step change in driving voltage is applied to a positioner through a series resistor there are often poorly damped oscillations of positioner motion. This is shown on FIG. 3 for two values of resistance in series with a Polytec Optronics, Inc. P-173 linear positioner. The time required for a single oscillation is about 180 microseconds but it takes 700 to 1000 microseconds for the oscillations to decay substantially. More damping is clearly required.

Figure 4:
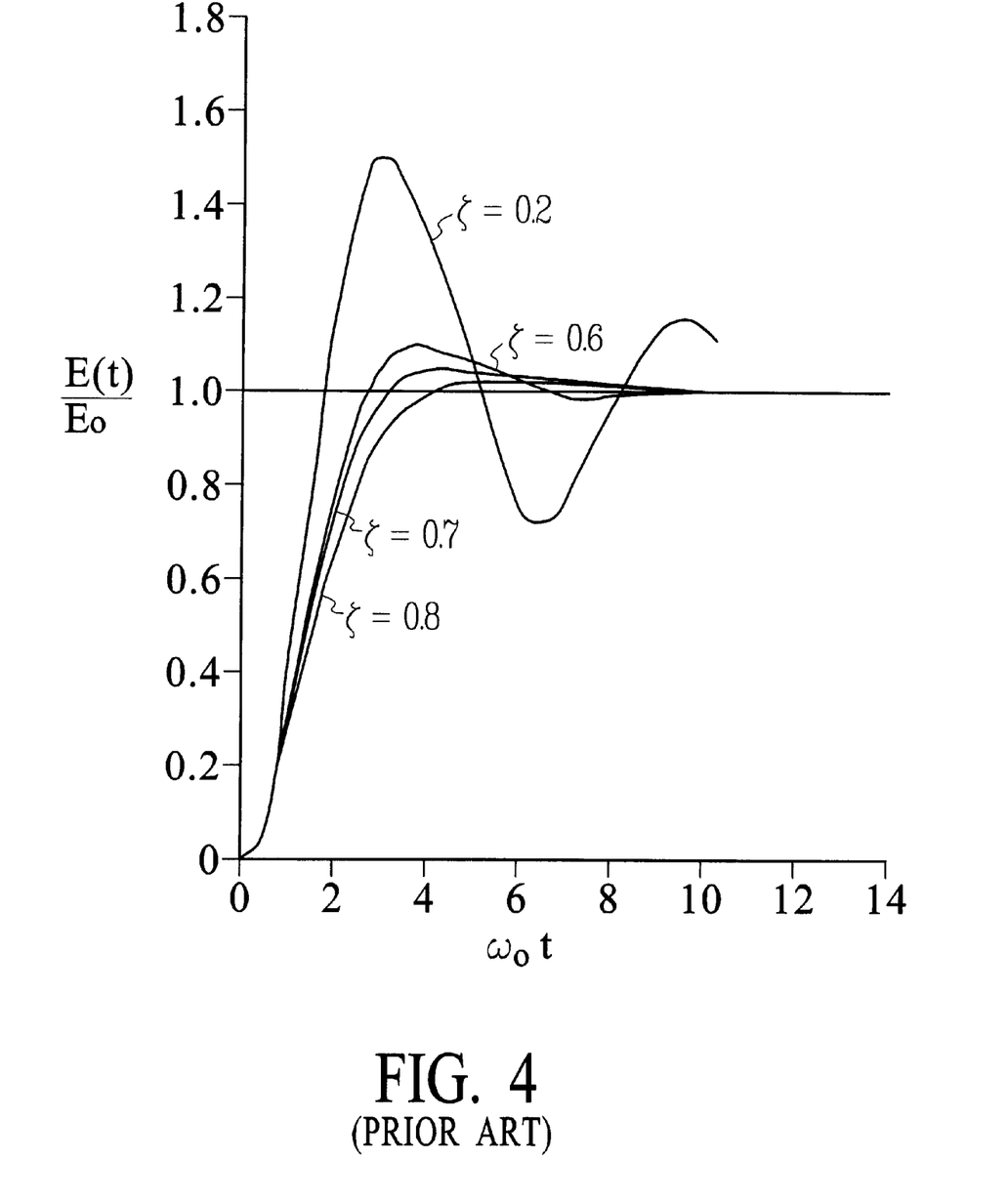

The response of a series LRC circuit to a step input of voltage is shown on FIG. 4 for various values of zeta, the fraction of critical damping present. There is a large overshoot of capacitor finel voltage and poorly damped oscillations when the damping is 0.2 of critical damping. Piezoelectric positioners and their attached loads often have damping as low as 0.05 to 0.10 of critical damping. When the damping is about 0.7 of critical damping the final voltage is reached in $\omega_0 t=3.285$ or $t=0.5228/f_0$ seconds and the overshoot is about 0.05 of the voltage change. More damping, such as 0.8 of critical damping, reduces the overshoot to about 0.01 of the voltage change.

Objects and Advantages

Accordingly, several objects and advantages of my invention are:

(a) to provide damping to a piezoelectric positioner by electronic means thereby permitting rapid position changes with little or no overshoot or oscillations of position.

(b) to provide electronic damping to a piezoelectric positioner without requiring the use of a velocity sensor or a position sensor.

(c) to provide electronic damping to a piezoelectric positioner which may be completely implemented by a few, simple, low cost components such as a capacitor, a few resistors, and a few operational amplifiers.

(d) to provide electronic damping to a piezoelectric positioner which is unaffected by changes in the natural frequency of oscillation of the positioner and its attached load.

(e) to provide electronic damping to a piezoelectric positioner the design of which requires no knowlwdge of the natural frequency of oscillation of the positioner and its load.

(f) to provide electronic damping of a piezoelectric positioner whereby the damping can be easily adjusted by resetting of one or two potentiometers in the electronic damping circuit.

(g) to provide electronic damping to a piezoelectric positioner and its load of up to critical damping or more and thereby provide greatly increased resistance to disturbances in position caused by external vibrations whereby the need for vibration isolation means and its associated cost may be reduced or eleiminated.

(h) to provide electronic damping to a piezoelectric positioner and its load of up to critical damping or more thereby removing restrictions on the shape of the driving waveform to obtain rapid position response without overshoots or poorly damped oscillations.

(i) to provide electronic damping to a piezoelectric positioner and thereby reduce or eliminate undesireable first order position resonances.

Further objects and advantages are to provide electronic damping to a piezoelectric positioner which can be easily designed and manufactured, which is esy to use, which is inexpensive, which is easily incorporated into new driving circuit designs and which is easily added to existing circuit hardware, which can tolerate changes in positioner dynamic characteristics without loss of damping performance, and which can significantly increase the ability of a piezoelectric positioner to move a load from one position to another rapidly and stably without objectionable overshoots and oscillations of position.

Still further objects and advantages will become apparent from a consideration of the ensuing description and drawings.

LIST OF REFERENCE NUMERALS

Numeral–Description
10 Summing Junction
12 Driving Amplifier
14 Piezoelectric Positioner
16 Differential Amplifier
18 Current Sensing Resistor—$R_2$
20 Current Sensing Resistor—$R_3$
22 Capacitor—$C_3$
24 Input Resistor—$R_4$
26 Feedback Resistor—$R_5$
28 Potentiometer—$R_6$
30 Operational Amplifier—$A_1$
32 Non-inverting Input Terminal of $A_1$
34 Inverting Input Terminal of $A_1$
36 Output Terminal of $A_1$
38 Operational Amplifier—$A_2$
40 Non-inverting Input Terminal of $A_2$
42 Inverting Input Terminal of $A_2$
44 Output Terminal of $A_2$
46 Input Resistor—$R_8$
48 Feedback Resistor—$R_7$
50 Optional Non-inverting Power Amplifier—$A_3$
52 Positioner Static Capacitance—$C_0$
54 Positioner Mechanical Compliance Representation—$C_1$
56 Positioner and Load Mass Representation—$L_1$
58 Positioner Damping Representation—$R_1$

SUMMARY OF THE INVENTION

In accordance with the present invention, active damping is provided to a piezoelectric positioner by negative feedback of positioner velocity information derived from a measurement of the total current passing through the positioner. This total current is the sum of a first current and a second current. The first current is that which passes through the static capacitance $C_0$ of the piezo electric positioner. The second current is that which passes through the dynamic impedance portion of the piezoelectric positioner which comprises $L_1R_1C_1$ in series and which causes motion of the piezoelectric positioner. A first signal is a first voltage proportional to the total current through the piezoelectric positioner. This first voltage is produced by a first resistor in series with the piezoelectric positioner. A second signal is a second voltage proportional to the first current through the piezoelectric positioner static capacitance $C_0$. A third signal is a third voltage produced by a second resistor in an impedance modeling the impedance of the static capacitance $C_0$ and the first resistor in series. This model impedance comprises a capacitance in series with the second resistor and driven by the same voltage driving the piezoelectric positioner and its series first resistor. The impedance modeling only requires that the model impedance have the same RC time constant as that of the piezoelectric positioner static capacitance $C_0$ and its series forst resistor. The actual impedance of the model impedance is preferably at least an order of magnitude greater than the impedance of the first resistor and $C_0$ in series to avoid adding significant load to the circuit driving both the model impedance and the piezoelectric positioner. Thus this third voltage is equal to the second voltage. When this third voltage is subtracted from the first voltage the difference voltage is equal to the voltage developed across the first resistor by the second current which passes through the dynamic impedance portion of the piezoelectric positioner. This difference voltage or difference signal is proportional to the second current which establishes the time rate of change of the voltage across $C_1$. This difference voltage is thus a synthesized positioner velocity signal. This difference voltage is used in a closed loop velocity feedback control to reduce the driving voltage and produce active damping of a piezoelectric positioner.

DESCRIPTION—MAIN EMBODIMENT

Figure 5:
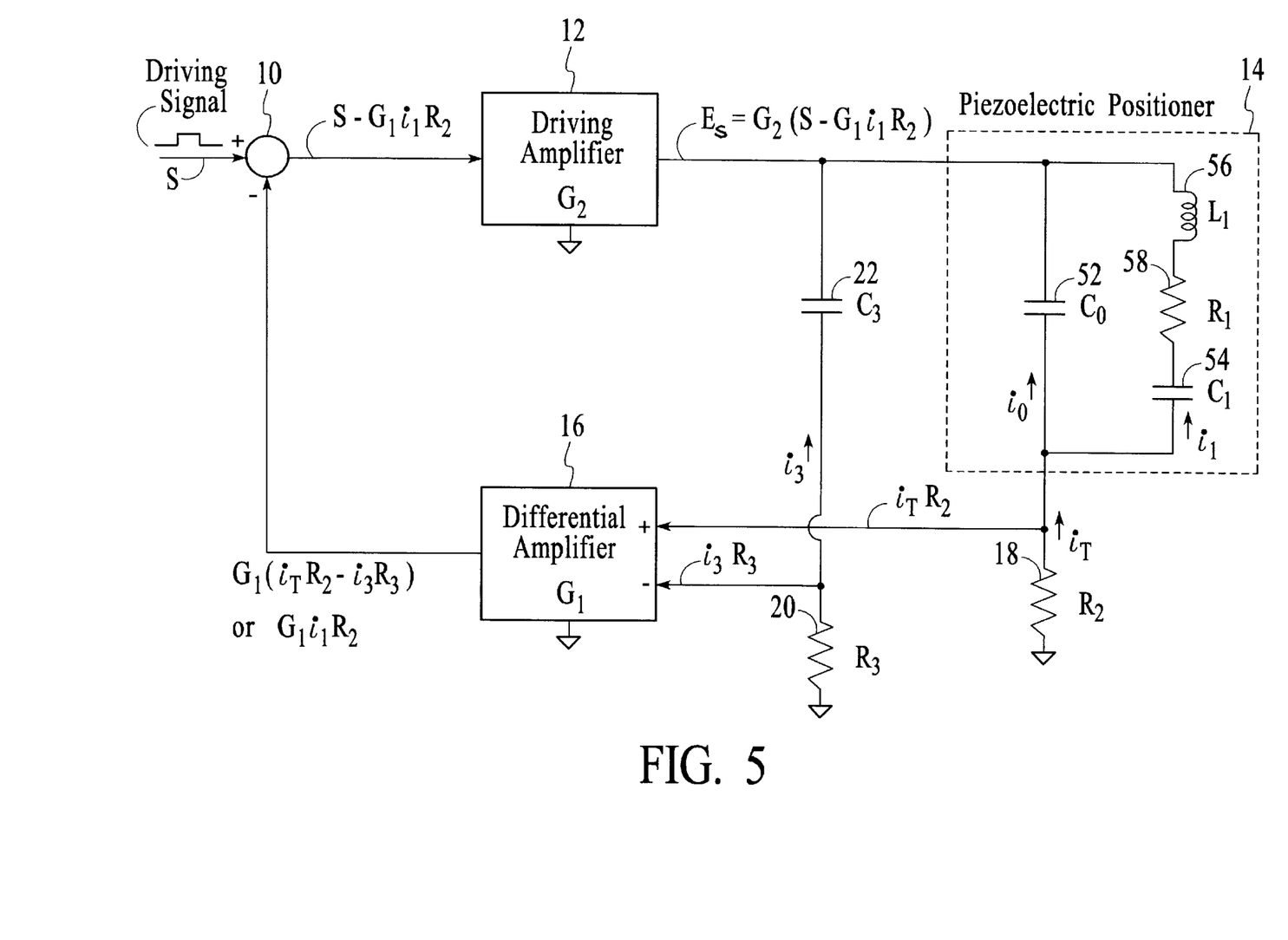

FIG. 5 is a Simplified Electrical Schematic of a Closed Loop Velocity Feedback Control. A piezoelectric 14 is electrically in series with a driving amplifier 12 and a current sensing resistor 18. A capacitor 22 and a resistor 20 are connected in series across the output of driving amplifier 12. The voltages developed across resistors 18 and 20 are inputs to a differential amplifier 16. The output of differential amplifier 16 and the driving signal are applied to a summing junction 10, the output of which is the input to the driving amplifier 12.

FIG. 5 also shows the substitute circuit diagram of a piezoelectric positioner with a load as shown on FIG. 1. Capacitor 52 is $C_0$ which represents the positioner static capacitance. Capacitor 54 is $C_1$ which represents the positioner and its support structure mechanical compliance. Inductance 56 is $L_1$ which represents the positioner distributed mass and its load mass. Resistor 58 is $R_1$ which represents the damping both internal and external to the positioner.

Figure 6:
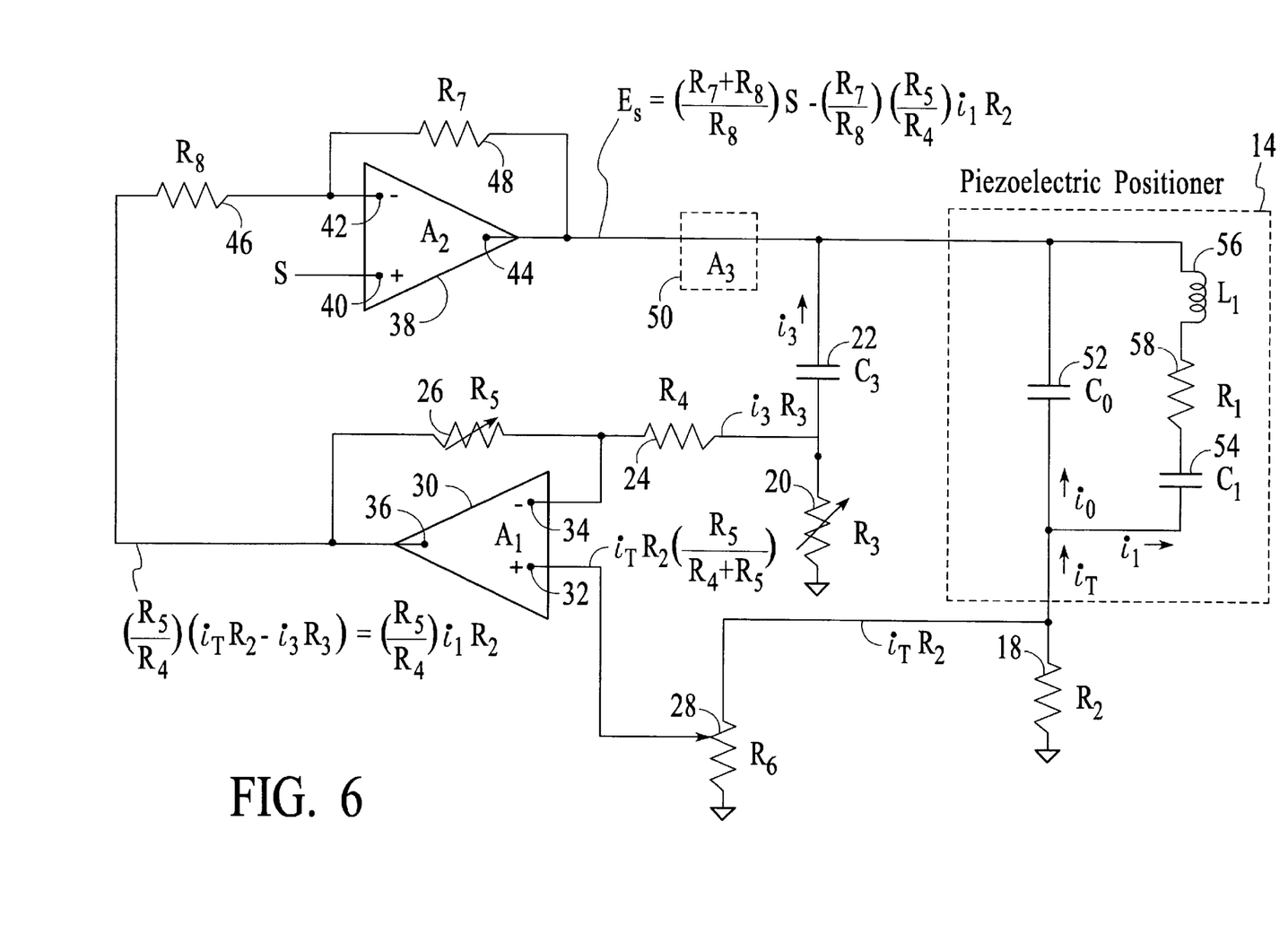

FIG. 6 is a Detailed Electrical Schematic of a Closed Loop Velocity Feedback Control. The differential amplifier 16 is represented by operational amplifier 30, $A_1$, with inverting input resistor 24, $R_4$, and feedback resistor 26, $R_5$, and non-inverting input potentiometer 28, $R_6$. The summing junction 10 and driving amplifier 12 are represented by operational amplifier 38, $A_2$, with inverting input resistor 46, $R_8$, with feedback resistor 48, $R_7$. An optional non-inverting power amplifier 50, $A_3$, has as input the output of operational amplifier 38 and an output connected to piezoelectric positioner 14 and capacitor 22. Resistors 20 and 26 are variable resistors for adjustments.

OPERATION—MAIN EMBODIMENT

A piezoelectric positioner mechanically is a spring mass system with some damping. This system can be represented electrically by the substitute circuit diagram shown on FIG. 1. The electrical impedance magnitude and phase angle of a piezoelectric positioner and its load mass is shown on FIG. 2 versus frequency and is expressed by Eq.1:

$$Z = \frac{1 + j\omega R_1 C_1 - \omega^2 L_1 C_1}{j\omega(C_0 + C_1)\left[1 + \frac{j\omega R_1 C_0 C_1}{(C_0 + C_1)} - \frac{\omega^2 L_1 C_0 C_1}{(C_0 + C_1)}\right]} \qquad \text{Eq. 1}$$

With small values of $R_1$ this impedance goes toward a zero at $$\omega_0 = \frac{1}{\sqrt{L_1 C_1}} \qquad \text{Eq. 2}$$

and goes toward a pole at $$\omega_p = \frac{1}{\sqrt{L_1 C_T}} \qquad \text{Eq. 3}$$

where $C_T$ is the series capacitance of $C_0$ and $C_1$ and $$C_T = \frac{C_0 C_1}{C_0 + C_1} \qquad \text{Eq. 4}$$

At $\omega_0=2\pi f_0$ the impedance of the series $L_1R_1C_1$ decreases to $R_1$ and the current through $L_1R_1C_1$ greatly increases for a fixed applied sinusoidal voltage compared to the current at lower and higher frequencies. This higher current causes large displacements of the load coupled to the piezoelectric positioner and a resonance occurs.

At frequencies higher than $f_0$ the impedance of the series $L_1R_1C_1$ is determined primarily by the inductance $L_1$ so current through $L_1R_1C_1$ decreases with increasing frequency. Positioner velocity also decreases with increasing frequency and positioner position decreases even more rapidly with increasing frequency. Naturally, the current from the driving circuit decreases at $f_0$.

Both the impedance zero and the impedance pole have their magnitudes limited by $R_1$, the positioner damping, which is often only 5 to 10% of critical damping. Such poor damping results in large overshoots followed by poorly damped oscillations when a piezoelectric is driven by a sudden change in applied voltage.

These characteristics make it clear that what is needed is more damping, especially at $f_0$. This damping can be supplied by a circuit which reduces the voltage applied to the piezoelectric positioner in proportion to the current through $L_1R_1C_1$. This current cannot be sensed directly. However, it is possible tototal current through $L_1R_1C_1$ and $C_0$ and then calculate the current through $L_1R_1C_1$.

Kirkhoff's Law requires that the total current $i_T$ through the piezoelectric positioner is equal to the sum of the current $i_0$ through capacitor $C_0$ and the current $i_1$ through $L_1R_1C_1$ or $$i_T = i_0 + i_1 \qquad \text{Eq.5}$$

Thus $$i_1 = i_T - i_0 \qquad \text{Eq.6}$$

If both sides of Eq.6 are multiplied by $R_2$ the result is:

$$i_1 R_2 = i_T R_2 - i_0 R_2 \qquad \text{Eq.7}$$

The voltage across $R_2$ due to the current $i_0$ induced by driving voltage $E_s$ is $$i_0R_2=E_sj\omega R_2C_0/(1+j\omega R_2C_0) \quad \text{Eq.8}$$

The voltage across $R_3$ in series with $C_3$ due to current $i_3$ induced by driving voltage $E_s$ is $$i_3R_3=E_sj\omega R_3C_3/(1+j\omega R_3C_3) \quad \text{Eq.9}$$

Dividing Eq.9 by Eq.8 the result is:

$$i_3R_3/i_0R_2=E_sj\omega R_3C_3(1+j\omega R_2C_0)/E_sj\omega R_2C_0(1+j\omega R_3C_3) \quad \text{Eq.10}$$

The right hand side of Eq.10 equals 1 when $$R_3C_3=R_2C_0 \quad \text{Eq.11}$$

and then $$i_3R_3=i_0R_2 \quad \text{Eq.12}$$

Substituting the value of $i_0R_2$ from Eq.12 in Eq.7 the result is:

$$i_1R_2=i_TR_2-i_3R_3 \quad \text{Eq.13}$$

Since both $i_TR_2$ and $i_3R_3$ are easily measured voltages it is possible to compute $i_1R_2$ by subtracting $i_3R_3$ from $i_TR_2$. This subtraction is accomplished by differential amplifier 16. The output of differential amplifier is thus $i_1R_2$ multiplied by the gain $G_1$ of differential amplifier 16 which is the desired piezoelectric positioner velocity signal needed for damping purposes. This velocity signal, $G_1i_1R_2$, is subtracted from driving signal S at summing junction 10, the result amplified by Driving amplifier 12 with gain $G_2$, and the output $E_s$ of driving amplifier 12 applied to both the model impedance $R_3C_3$ and the piezoelectric positioner 14 and its series resistor 18. The result is the electronic damping of the piezoelectric positioner.

FIG. 6 shows a more detailed circuit that performs the same functions as the simplified circuit shown on FIG. 5. The differential amplifier 16 is replaced by operational amplifier 30 having an inverting input gain of $R_4/R_5$ and a non-inverting input gain of $(R_4+R_5)/R_5$. To compensate for the higher gain of the non-inverting input potentiometer 28 is set to deliver to terminal 32 a voltage equal to $R_5/(R_4+R_5)$ times $i_TR_2$ from resistor 18. With these gains the output voltage of amplifier 30 will be $(R_5/R_4)(i_TR_2-i_3R_3)$. Since $i_3R_3=i_0R_2$ per Eq.12 this is also $(R_5/R_4)(i_TR_2-i_0R_2)$ or $(R_5/R_4)i_1R_2$ per Eq.7. The loading effect of potentiometer 28 will normally be negligble since the resistance of potentiometer 28 is made at least 1000 times greater than resistor 18. Similarly, resistor 24 can be made at least 1000 times greater than potentiometer 20 to avoid loading of potentiometer 20 by resistor 24.

The summing function of junction 10 and the amplifying function of amplifier 12 are performed by operational amplifier 38. The input driving signal S is applied to the non-inverting terminal 40 of amplifier 38 which has a gain of $(R_7+R_8)/R_8$. The output of amplifier 30 is applied through resistor 46 to the inverting terminal 42 of amplifier 38 which has a gain of $R_7/R_8$. Thus the output of amplifier 30 is $S(R_7+R_8)/R_8-(R_7/R_8)(R_5/R_4)i_1R_2$ which is the control signal applied to the piezoelectric positioner 14 and its series resistor 18.

The effect of the term $-(R_7/R_8)(R_5/R_4)i_1R_2$ is to reduce the voltage driving the piezoelectric positioner 14 inproportion to the current $i_1$ through $L_1R_1C_1$. The effect is the same as adding to the value of $R_1$ a resistance equal to $(R_7/R_8)$ $(R_5/R_4)R_2$ or loop voltage gain times $R_2$. The loop voltage gain is the control signal voltage $E_s$ applied to the piezoelectric positioner 14 divided by the voltage across resistor 18 and includes the voltage gain of the optional non-inverting power amplifier 50.

In the series $L_1R_1C_1$ circuit critical damping is achieved when the series resistance has the value $$R_c=2\sqrt{L_1/C_1} \quad \text{Eq.14}$$

Thus, critical damping is achieved when $R_1+(R_7/R_8)(R_5/R_4)$ $R_2=2\sqrt{L_1/C_1}$. Variable resistor $R_5$ may be adjusted to obtain critical damping or whatever damping is desired. If 0.7 of critical damping is desired then $$R_1+(R_7/R_8)(R_5/R_4)\,R_2=(0.7)2\sqrt{L_1/C_1} \quad \text{Eq.15}$$

Adjustments to resistor $R_5$ may require resetting potentiometer $R_6$. Values of $L_1$, $R_1$, $C_1$, and $C_0$ may be determined by the methods detailed in U.S. Pat. No. 5,714,831 and by other methods known to those skilled in the art.

It is important in any closed loop control system to examine the system for stability. This may be done by examining the open loop transfer function to insure that when the phase shift is 180° the gain is less than 1. More rigorously, on a Nyquist plot, the locus of the open loop transfer function plot must not encircle the −1 point in a clockwise direction with increasing frequency. The open loop transfer function for the velocity feedback control system shown on FIG. 5 with $R_2C_0=R_3C_3$ is:

$$\frac{\text{Output}}{\text{Input}}=-\frac{G_1G_2j\omega R_2C_1}{[1+j\omega(R_1+R_2)C_1-\omega^2L_1C_1]} \quad \text{Eq. 16}$$

At very small $\omega$ $$\frac{\text{Output}}{\text{Input}}=-G_1G_2j\omega R_2C_1 \text{ (approximately)} \quad \text{Eq. 17}$$

This approaches 0 as $\omega$ approaches 0 and has 90° phase lead. At $\omega=\omega_0(f=f_0)$ $$\frac{\text{Output}}{\text{Input}}=-G_1G_2\frac{R_2}{(R_1+R_2)} \quad \text{Eq. 18}$$

and there is no phase shift.
At very large $\omega$ $$\frac{\text{Output}}{\text{Input}}=-\frac{G_1G_2R_2}{j\omega L_1} \quad \text{Eq. 19}$$

This approaches 0 as $\omega$ approaches infinity and has 90° phase lag. Eq.20

Figure 7:
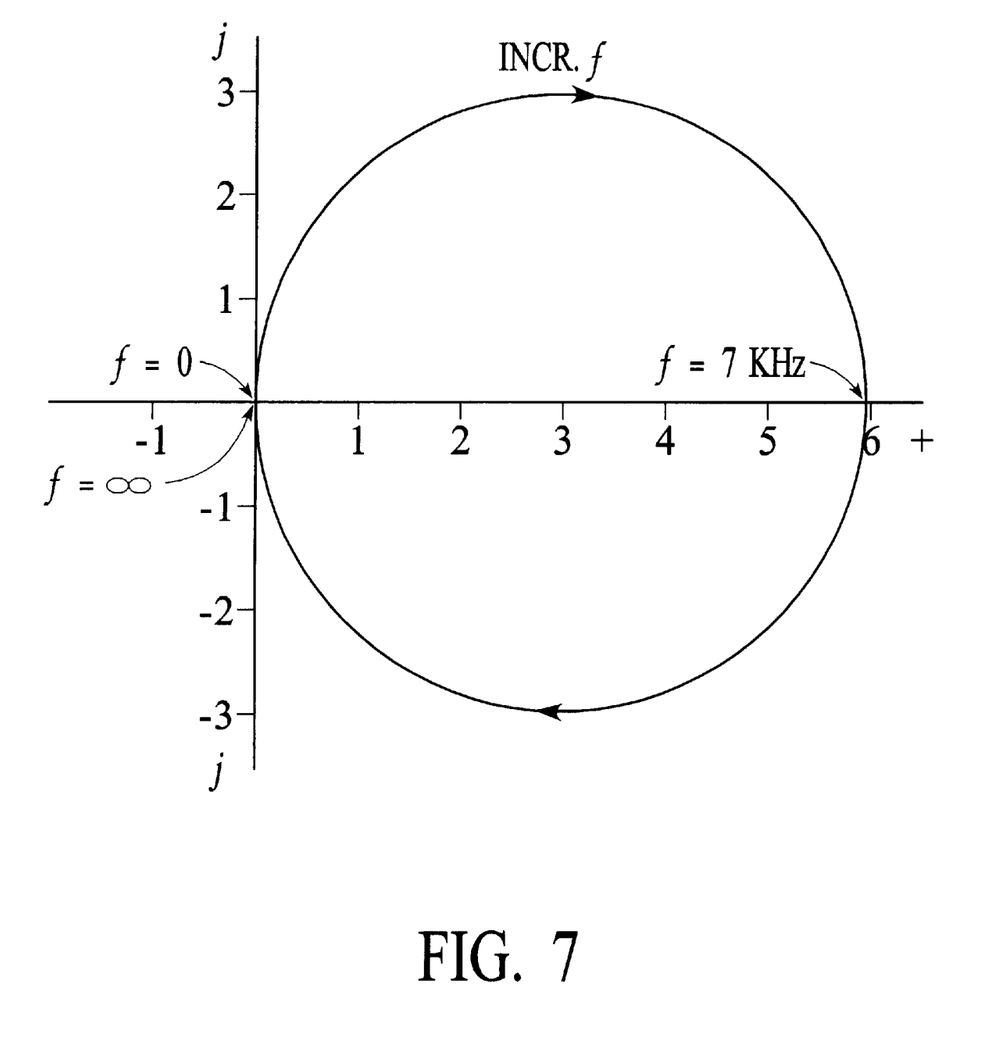

The resulting Nyquist plot of this open loop transfer function is shown on FIG. 7. It is clear that the −1 point is not only not encircled bu that the locus does not come close to the −1 point for any value of the open loop gain $G_1G_2$.

The open loop gain at $f_0$ is $G_1G_2R_2/(R_1+R_2)$ or the added damping resistance divided by the sum of the original damping resistance $R_1$ and the resistance $R_2$. Thus, if the original damping with $R_2$ present was 0.1 of critical and the added damping is 0.9 of critical the open loop gain at $f_0$ will be 0.9/0.1=9. This is a modest gain and indicates that the foregoing analysis is appropriate even though it did not consider other possible system elements and their gain/phase shift characteristics. For this to be appropriate the amplifiers 12, 16, 1nd 50 must have substantially flat responses with small phase shift out to and beyond $f_0$.

The effect of a mismatch of $R_2C_0$ and $R_3C_3$ time constants must be considered also. When perfectly matched the feedback function is as described. When $R_3C_3$ is smaller than $R_2C_0$ the negative feedback function causes a reduction of voltage, $E_s$, to be applied to to the piezoelectric positioner which reduces its current and slows down its rate of response to position changes. When $R_3C_3$ is greater than $R_2C_0$ the negative feedback function causes an increase in the voltage, $E_s$, to be applied to the piezoelectric positioner which increases its rate of response to to changes in position. Thus exact matching of $R_2$ $C_0$ is not required providing some changes in speed of positioner response can be tolerated.

DESCRIPTION AND OPERATION— ALTERNATIVE EMBODIMENT

It is clear that when the output voltage, $E_s$, of driving amplifier 12 is constant there is no voltage developed across resistor 20, $R_3$. For this condition capacitor 22, $C_3$ and resistor 20, $R_3$ could be removed from the circuits shown on FIG. 5 and FIG. 6 and there would still be a voltage generated across resistor 18, $R_2$ due to current $i_1$ which also flows through inductance 56, resistance 58, and capacitance 54. This current $i_1$ is produced by the piezoelectric voltage generated within $C_1$ by the positioner strain. This This effect is present both before and after a transient in voltage applied to the piezoelectric positioner. Thus damping of the piezoelectric positioner would still be present and would be effective to dampen oscillations induced by external mechanical vibrations or by previously applied changes in voltage driving the piezoelectric positioner. However, the added damping would not be as effective in reducing or eliminating over-shoots of positioner position.

With capacitor 22, $C_3$, and resistor 20, $R_3$, removed from the circuit shown on FIG. 5 there would still be negative feedback of the current $i_0$ through capacitor 52, $C_0$, which would tend to reduce the voltage $E_s$ driving the piezoelectric positioner 14. The net effect would be the same as increasing resistor 18, $R_2$, by the loop gain $G_1G_2$ and eliminating the negative feedback. Thus the time constant $R_2C_0$ would be increased to $G_1G_2R_2C_0$ with negative feedback and without capacitor 22 and resistor 20 in the circuit of FIG. 5. This may be desireable in some cases since it reduces the current $i_T$ due to sudden changes in the driving voltage $E_s$.

From the foregoing it follows that when the time constants $R_2C_0$ are not exactly equal there can be a feedback effect of current $i_0$. When $R_3C_3$ is smaller than $R_2C_0$ the effect of $i_0$ is to increase the apparent value of $R_2$. When $R_3C_3$ is larger than $R_2C_0$ the effect of $i_0$ is to decrease the apparent value of $R_2$.

Similarly, when $R_3C_3$ is equal to $R_2C_0$ but potentiometer 28, $R_6$, is set too small the effect is that the $i_3R_3$ voltage from $R_3C_3$ is too big to cancel the $i_0R_2$ voltage from $R_2C_0$ and the effect is to decrease the apparent value of $R_2$. Vice versa, when potentiometer 28 is set too large the effect is to increase the apparent value of $R_2$.

The alternative embodiments thus consist of the following used in any combination or individually:
(a) Eliminating resistor 20, $R_3$, and capacitor 22, $C_3$.
(b) Making $R_3C_3$ time constant larger or smaller then $R_2C_0$.
(c) Making the setting of potentiometer 28, $R_6$, larger or smaller than $R_5/(R_4+R_5)$.

Conclusions, Ramifications, and Scope

Accordingly, the reader will see that damping can be provided to a piezoelectric positioner by simple electronic means to suppress any unwanted mechanical oscillations induced by driving electrical signals or by external vibrations. The electronic means requires no position or velocity sensor. Furthermore, the electronic means for providing damping to a pieaoelectric positioner has the added advantage that:

it permits a freer choice of the waveforms of the voltage driving a piezoelectric positioner;

it permits easy adjustment of the degree of damping added to a piezoelectric positioner;

it provides added damping to a piezoelectric positioner which is not dependent upon the mechanical resonance frequency of the piezoelectric positioner;

it provides added damping to a piezoelectric positioner which can reduce or eliminate the need for vibration isolators;

it provides added damping to a piezoelectric positioner which can permit faster movement from one position to another position without objectionable overshoots or oscillations of the final position;

it provides added damping to a piezoelectric positioner which can be implemented by two operational amplifiers, one capacitor, and a few resistors;

it provides added damping to a piezoelectric positioner which is not affected by ageing, wear, or changes in ambient temperature;

it provides added damping to a piezoelectric positioner which is low cost, simple, and reliable.

Although the description above contains many specificities, these should not be construed as limiting the scope of the invention but as merely providing illustrations of some of the preferred embodiments of this invention. For example, the analog computations using operational amplifiers could be performed by digital means; the analog amplifiers could be replaced by magnetic amplifiers, pulse width modulation amplifiers, or other amplifiers known to those skilled in the art; currents could be sensed by Hall effect devices sensing the current directly or sensing the magnetic field on a wire carrying the current; the summing junction could be placed after the driving amplifier instead of before it.

Thus, the scope of the invention should be determined by the appended claims and their legal equivalents, rather than by the examples given.

I claim:

1. A method for adding damping to a piezoelectric positioner by electronic means, comprising the steps of:

(a) applying a control voltage driving said piezoelectric positioner to control a physical position of said piezoelectric positioner, and (b) producing a first voltage proportional to the total current passing through said piezoelectric positioner in response to said control voltage, and (c) producing a second voltage proportional to the current passing through the static capacitance portion of said piezoelectric positioner in response to said control voltage, and (d) subtracting said second voltage from said first voltage to produce a third voltage proportional to the current passing through the dynamic impedance portion of said piezoelectric positioner impedance, and (e) amplifying or attenuating said third voltage to obtain the desired degree of damping, and (f) subtracting said amplified or attenuated third voltage from said control voltage applied to said piezoelectric positioner, whereby a negative feedback effect is produced for the current flowing through said dynamic impedance thereby producing the effect of damping added to said piezoelectric positioner.

2. The method for adding damping to a piezoelectric positioner by electronic means of claim 1 wherein the proportionality of said first voltage to current and the proportionality of said second voltage to current are substantially identical.

3. The method for adding damping to a piezoelectric positioner by electronic means of claim 1 wherein said dynamic impedance portion is comprised of an inductance representing the active mass of said piezoelectric positioner and its attached load, a first resistance representing the damping of said piezoelectric positioner and its attached load, and a first capacitance representing the compliance of said piezoelectric positioner and its supporting structure with said inductance, said first resistance, and said first capacitance being connected in series.

4. The method for adding damping to a piezoelectric positioner by electronic means of claim 1 wherein said first voltage is produced by a second resistor in series with said piezoelectric positioner, wherein this combination is connected to said control voltage.

5. The method for adding damping to a piezoelectric positioner by electronic means of claim 4 wherein said second voltage is produced by a third resistor in series with a second capacitance wherein said third resistor and said second capacitance have an RC time constant substantially equal to the RC time constant of said second resistor in series with said piezoelectric positioner static capacitance and wherein said third resistor and said second capacitance in series are connected to said control voltage.

6. A method for adding damping to a piezoelectric positioner by electronic means, comprising the steps of:

(a) applying a control voltage to said piezoelectric positioner to control a physical position of said positioner, and (b) producing a first voltage proportional to the total current passing through said positioner inresponse to said control voltage, and (c) amplifying or attenuating said first voltage to obtain the desired degree of damping, and (d) subtracting said amplified or attenuated first voltage from said control voltage to reduce the voltage applied to daid piezoelectric positioner, whereby a negative feedback effect is produced for the current flowing through said piezoelectric positioner thereby producing the effect of damping added to said piezoelectric positioner.

7. A circuit for producing a piezoelectric positioner velocity signal comprising:

(a) means for measuring the total current through said piezoelectric positioner and producing a first signal proportional to said total current, and (b) means for modeling the current through the static capacitance portion of said piezoelectric positioner and producing a second signal proportional to said current through said static capacitance portion of said piezoelectric positioner wherein the proportionality of said first signal to current and the proportionality of said second signal to current are substantially identical, and (c) means for subtracting said second signal from said first signal to produce a difference signal proportional to the current flowing through the dynamic impedance portion of said piezoelectric positioner which in turn is proportional to said piezoelectric positioner velocity.

8. The circuit for producing a piezoelectric positioner velocity signal of claim 7 wherein the means for measuring said total current through said piezoelectric positioner is the voltage developed across a resistor in series with said piezoelectric positioner.

9. The circuit for producing a piezoelectric positioner velocity signal of claim 7 wherein the means for modeling said current through said static capacitance portion of said piezoelectric positioner comprises a first resistor and a first capacitor connected in series wherein this first combination is driven by the same voltage driving a second combination comprising said piezoelectric positioner static capacitance connected in series with a second resistor wherein said first combination has an RC time constant of a predetermined value substantially identivial to the RC time constant of the second combination, whereby the voltage signals developed across said first resistor and said second resistor are substantially identical for all significant operating frequencies of said driving voltage.

10. An apparatus for control of a piezoelectric positioner comprising;

(a) control means for generating a control signal to drive a piezoelectric positioner to a commanded position wherein said control means includes means for reducing said control signal in response to a piezoelectric positioner velocity signal, and (b) computing means for synthesizing said piezoelectric positioner velocity signal comprising subtracting means to subtract from a first signal for the total current through said piezoelectric positioner a second signal for the current through said piezoelectric positioner static capacitance thereby producing a third signal which is said piezoelectric positioner velocity signal, and (c) synthesizing means for producing said second signal comprising measuring means to measure the current through a model impedance driven by said control voltage signal wherein said model impedance has attenuation and phase characteristics substantially identical to those for said piezoelectric positioner static capacitance and any impedance in series therewith, and (d) amplifying or attenuating means to modify said third signal to obtain the desired degree of damping of said piezoelectric, and (e) subtracting means to subtract said modified third signal from said control signal whereby the voltage applied to said piezoelectric positioner is reduced as said modified third signal increases, thereby producing active damping of the motion of said piezoelectric positioner.

11. The apparatus for control of a piezoelectric positioner of claim 10 wherein said model impedance comprises a capacitor and a resistor in series and wherein said second signal is derived from the voltage developed across said resistor and said impedance in series with said piezoelectric positioner is also a resistor.

12. The apparatus for control of a piezoelectric positioner of claim 10 wherein said first signal is derived from the voltage developed across a resistor in series with said piezoelectric positioner.

13. The apparatus for control of a piezoelectric positioner of claim 10 wherein said first signal is derived from a Hall effect device in a fixed magnetic field sensing total current through said piezoelectric positioner.

* * * * *